US009429148B2

(12) United States Patent
Chang et al.

(10) Patent No.: US 9,429,148 B2
(45) Date of Patent: Aug. 30, 2016

(54) FAN CONTROL SYSTEM AND FAN CONTROLLING METHOD THEREOF

(71) Applicant: Wistron Corporation, New Taipei (TW)

(72) Inventors: Yao-Tsung Chang, New Taipei (TW);
Ming-Chih Chen, New Taipei (TW);
Al-Tsung Li, New Taipei (TW);
Wei-Cheng Chou, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 450 days.

(21) Appl. No.: 13/831,069

(22) Filed: Mar. 14, 2013

(65) Prior Publication Data
US 2013/0309061 A1  Nov. 21, 2013

(30) Foreign Application Priority Data

May 21, 2012 (TW) .............................. 101118061 A

(51) Int. Cl.
| | |
|---|---|
| *F04B 17/00* | (2006.01) |
| *F04D 15/00* | (2006.01) |
| *H01L 41/04* | (2006.01) |
| *H01L 41/06* | (2006.01) |
| *F04D 27/00* | (2006.01) |

(52) U.S. Cl.
CPC ............. *F04B 17/003* (2013.01); *F04D 15/00* (2013.01); *F04D 27/004* (2013.01); *H01L 41/042* (2013.01); *H01L 41/06* (2013.01)

(58) Field of Classification Search
CPC .. F04B 17/003; F04B 19/006; F04B 43/046; F04B 43/095; F04B 45/04; H01L 41/04; H01L 41/042; H01L 41/06; H01L 41/0973
See application file for complete search history.

(56) References Cited

U.S. PATENT DOCUMENTS

| | | | | |
|---|---|---|---|---|
| 4,939,402 A * | 7/1990 | Hirayama | ............. | B06B 1/0261 |
| | | | | 310/316.01 |
| 7,358,695 B2 | 4/2008 | Tien | | |
| 8,076,822 B2 * | 12/2011 | Ohsawa | ................ | F04B 43/046 |
| | | | | 310/317 |
| 9,006,956 B2 * | 4/2015 | Li | ........................... | F04D 33/00 |
| | | | | 310/315 |
| 2005/0067921 A1 * | 3/2005 | Yamamoto | ............. | H02N 2/163 |
| | | | | 310/317 |
| 2009/0243431 A1 * | 10/2009 | Ohsawa | ................ | F04B 43/046 |
| | | | | 310/317 |
| 2009/0288488 A1 * | 11/2009 | Yamakawa | ......... | H01L 41/1132 |
| | | | | 73/579 |
| 2010/0059127 A1 * | 3/2010 | Shibata | ................. | F04B 43/046 |
| | | | | 137/565.11 |
| 2014/0159620 A1 * | 6/2014 | Yamamoto | ............ | H01L 41/042 |
| | | | | 318/116 |

* cited by examiner

*Primary Examiner* — Patrick Hamo
(74) *Attorney, Agent, or Firm* — Muncy, Geissler, Olds & Lowe, P.C.

(57) ABSTRACT

A fan control system and a fan controlling method thereof are disclosed. The fan control system is used to an electronic apparatus for controlling an air pump fan device. The fan controlling method includes following steps: setting a plurality of vibrating working periods of the air pump fan device; setting a plurality of vibrating frequencies of the air pump fan device, wherein each vibrating frequency has a different vibrating frequency value; detecting a temperature of the electronic apparatus; determining whether the temperature of the electronic apparatus exceeding a first setting temperature; and if yes, controlling the air pump fan device to vibrate according to the plurality of vibrating frequencies during the plurality of vibrating working periods, wherein adjacent vibrating working periods of the plurality of vibrating working periods correspond to different vibrating frequency values.

15 Claims, 8 Drawing Sheets

FAN CONTROL SYSTEM AND FAN CONTROLLING METHOD THEREOF

BACKGROUND OF THE INVENTION

1. Field of the Invention

The invention relates to a fan control system and a fan controlling method thereof, and more particularly relates to a fan control system and a fan controlling method thereof to prevent a fan to continuously vibrate under a fixed frequency.

2. Description of the Related Art

Along with the advancement of technology, current electronic products are more and more slim and light. On the other hand, when an electronic apparatus operates, certain heat will generate. Without proper heat dissipation system, the electronic apparatus might be damaged due to temperature arising. Conventional heat dissipation system mainly utilizes a fan of rotational vane to perform heat dissipation, but such fan may not be suitable for a slim and light electronic product due to axial structure of the fan. Therefore, a smaller air pump fan device has been developed in the prior art.

An air pump fan device may be classified as piezoelectric fan made of piezoelectric material or an electromagnetic fan made of magnet and coils based on magnetic field operation. Taking piezoelectric fan as an example, a voltage is applied to a piezoelectric material to change shape of the piezoelectric material to further bring a thin plate connected to the piezoelectric material to vibrate. Therefore, the simple harmonic motion of the thin plate cause wind flow to achieve cooling effect. The air pump fan device has smaller size to save capacity for containing. In addition, the air pump fan device consumes less power and saves more energy.

However, it is unlike conventional fans with vanes, the air pump fan device in the prior art needs to be controlled to vibrate under an optimum resonance frequency. Under such resonance frequency, the vane has maximum amplitude for generating larger wind. But, when it is continuously vibrated under the same resonance frequency, there will be a single tone noise with narrow frequency and makes a user feel uncomfortable.

Therefore, it is necessary to design a new fan control system and fan controlling method thereof to solve conventional deficiency.

SUMMARY OF THE INVENTION

A major objective of the present invention is to provide a fan control system that prevents a fan to continuously vibrate under a fixed frequency.

Another objective of the present invention is to provide a fan controlling method used in such fan control system.

To achieve the aforementioned objectives, the fan controlling method of the present invention is used in an electronic apparatus for controlling an air pump fan device. The air pump fan device is installed in the electronic apparatus. The method includes the following steps: setting a plurality of vibrating working periods of the air pump fan device; setting a plurality of vibrating frequencies of the air pump fan device, wherein each vibrating frequency has a different vibrating frequency value; detecting a temperature of the electronic apparatus; determining whether the temperature of the electronic apparatus exceeding a first predetermined temperature; and if yes, controlling the air pump fan device to vibrate according to the plurality of vibrating frequencies during the plurality of vibrating working periods, wherein adjacent vibrating working periods of the plurality of vibrating working periods correspond to different vibrating frequency values.

A fan control system of the present invention is installed in an electronic apparatus to control an air pump fan device, wherein the air pump fan device is installed in the electronic apparatus. The fan control system includes a temperature sensing module and a control module. The temperature sensing module is used for detecting a temperature in the electronic apparatus. The control module is electrically connected to the temperature sensing module and the air pump fan device for setting a plurality of vibrating working periods and a plurality of vibrating frequencies of the air pump fan device. Each of vibrating frequency has a different vibrating frequency value. When the temperature in the electronic apparatus exceeds a first predetermined temperature, the control module generates a control signal for controlling the air pump fan device to vibrate during the plurality of vibrating working periods according to the plurality of vibrating frequencies. Adjacent vibrating working periods of the plurality of vibrating working periods correspond to different vibrating frequencies.

The fan control method of the present invention further includes the following steps: setting a plurality of vibrating working periods of the air pump fan device; setting a plurality of vibrating frequencies of the air pump fan device; setting a plurality of stop working periods between adjacent vibrating working periods of the plurality of vibrating working periods; detecting a temperature of the electronic apparatus; determining whether the temperature of the electronic apparatus exceeding a first predetermined temperature; if yes, controlling the air pump fan device to vibrate during the plurality of vibrating working periods according to one of the vibrating frequencies and to stop vibration during stop working periods.

Other objects, advantages, and novel features of the invention will become more apparent from the following detailed description when taken in conjunction with the accompanying drawings.

DETAILED DESCRIPTION OF THE PREFERRED EMBODIMENT

To more clearly explain aforementioned and other objectives, features and advantages of the present invention, the following disclosure is provided with specific embodiments with corresponding figures.

Figure 1:
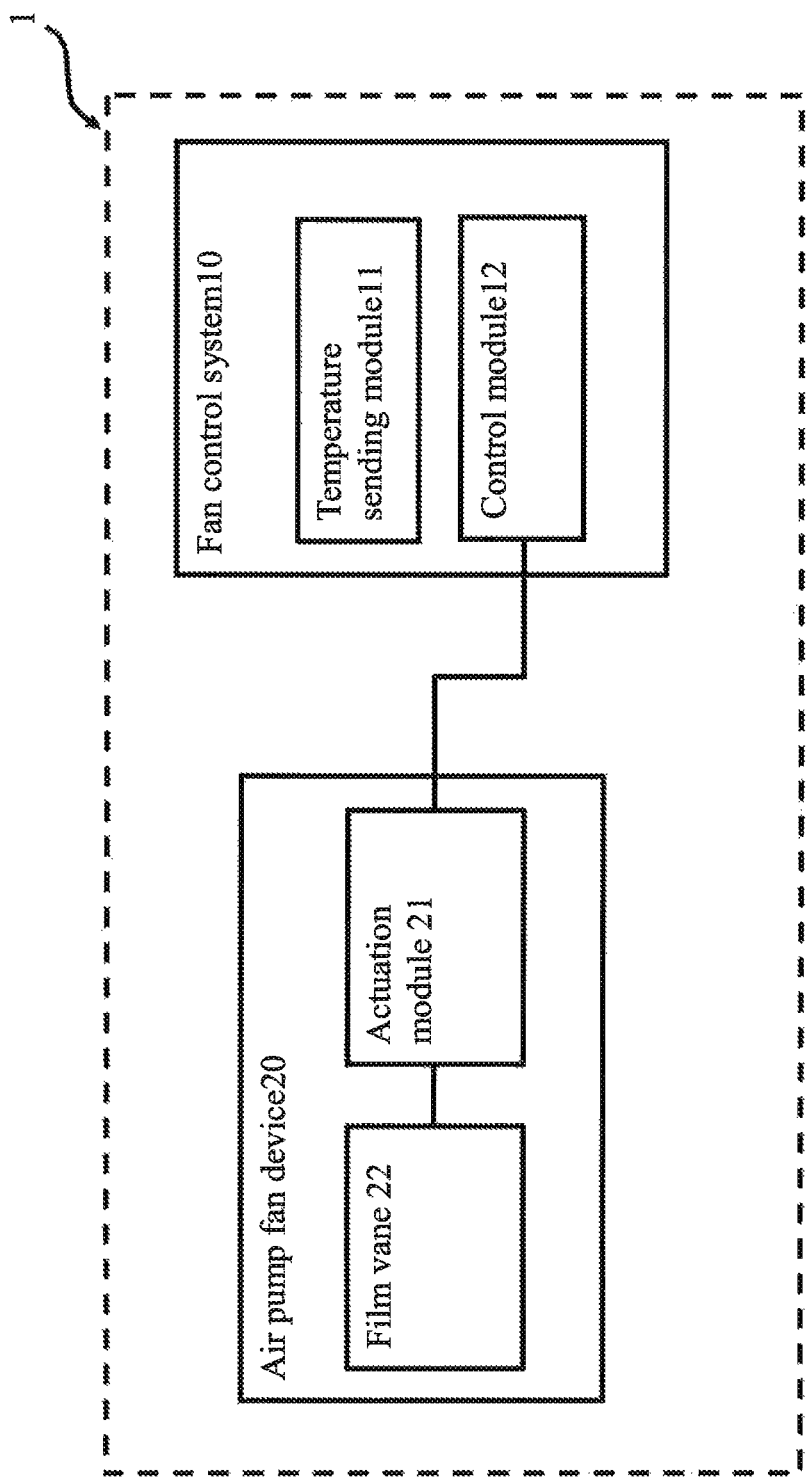
FIG. 1 is a systematic diagram of a fan control system of the present invention.

Please refer to FIG. 1, which illustrates a systematic diagram of a fan control system of the present invention.

The fan control system 10 is used in an electronic apparatus 1 for controlling vibration of an air pump fan device 20 so that the air pump fan device cools down the electronic apparatus 1. The electronic apparatus 1 may be a notebook computer, a smart phone or a tablet, but other configurations are also covered by the present invention.

The air pump fan device 20 includes an actuation module 21 and a film vane 22. The air pump fan device 20 may be a piezoelectric fan or an electromagnetic fan. The actuation module 21 is connected to the film vane 22 to control the film vane 22 to vibrate according to a received signal. When the air pump fan device 20 is of a piezoelectric fan, the actuation module 21 is of piezoelectric material and extends or shrinks according to a positive or negative state of a received voltage signal. Consequently, the film vane 22 swings by following the actuation module 21 to generate wind flow. On the other hand, if the air pump fan device 20 is of an electromagnetic fan, the actuation module 21 is of magnet and metal coils, which magnetic field is changed according to received current signal so that the film vane 22 swings following the actuation module 21 to generate wind flow. Because the operation principle of the piezoelectric fan or electromagnetic fan has been well know to person skilled in the art, further detail description thereto is not repeated here.

The fan control system 10 includes a temperature sensing module 11 and a control module 12. The temperature sensing module 11 may be a heat sensitive resistor, an infrared detection device or other sensors for detecting a temperature in the electronic apparatus 1. Since methods for temperature detection does not play major role for the present invention, they are not further explained here again. The control module 12 may be implemented by a hardware, a hardware combined with firmware, or a hardware combined with software, but other configurations are also covered by the present invention. The control module 12 is electrically connected to the temperature sensing module 11 and the actuation module 21 of the air pump fan device 20 so as to determine whether the temperature in the electronic apparatus 1 is too high according to measured result of the temperature sensing module 11. When the temperature in electronic apparatus 1 is too high, the control module 12 generates a control signal to the actuation module 21 of the air pump fan device 20 to control the film vane 22 of the air pump fan device 20 to actuate for decreasing the temperature in the electronic apparatus 1. In addition, the control module 12 may set vibrating working periods, stop working periods and vibrating frequencies of the air pump fan device 20. Therefore, the air pump fan device 20 vibrates during vibrating working periods according to vibrating frequencies and stops vibrating during stop working periods.

Figure 2:
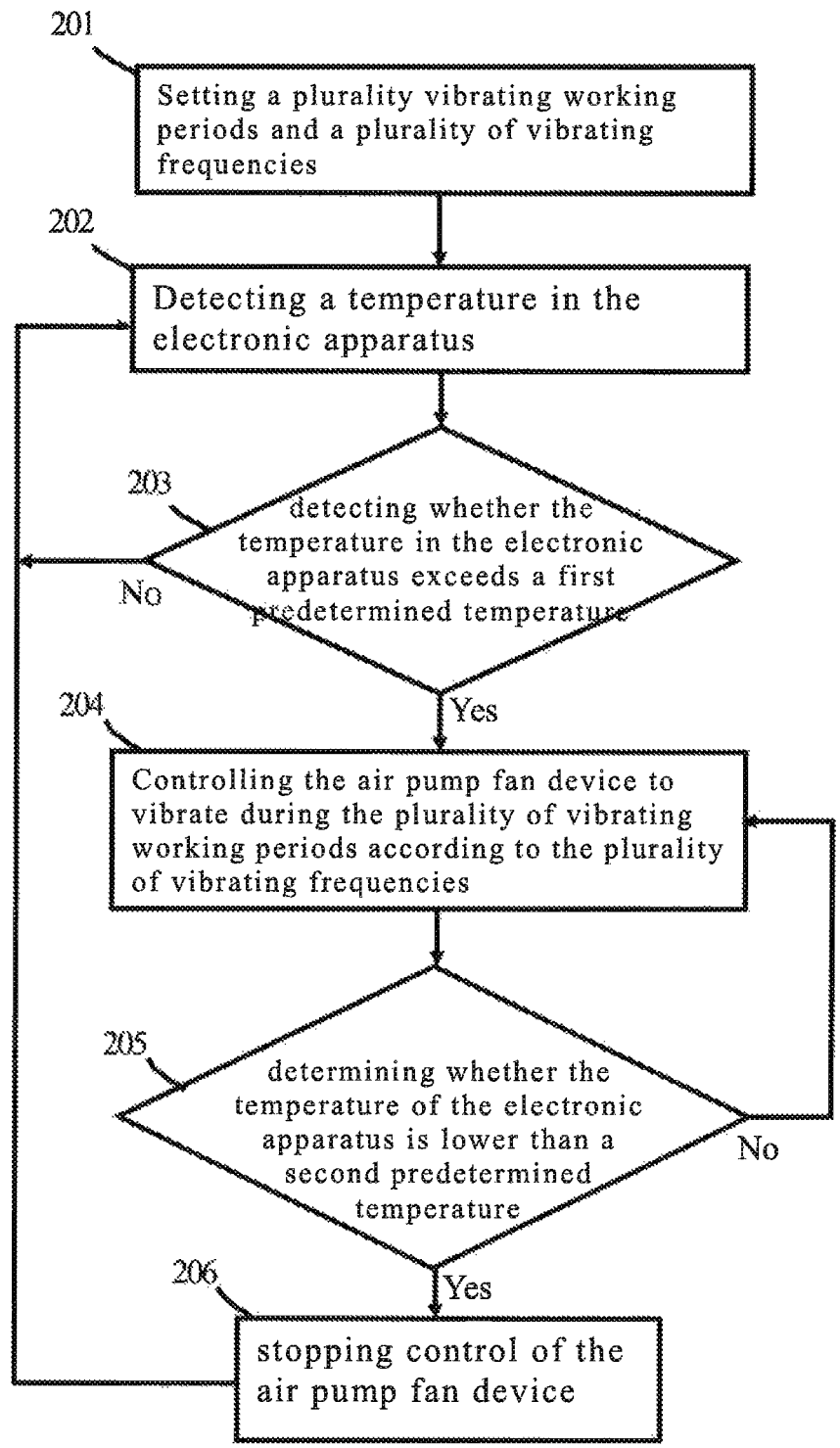
FIG. 2 is a flowchart for a fan control method of a first embodiment of the present invention.

Next, please refer to FIG. 2, which illustrates a flowchart for a fan control method of a first embodiment of the present invention. It is noted that although the method is controlled by the fan control system 10 to achieve the object of the present invention, the method can be applied in other system to serve its purpose.

First, step 201 is performed by setting a plurality vibrating working periods and a plurality of vibrating frequencies.

Figure 2A:
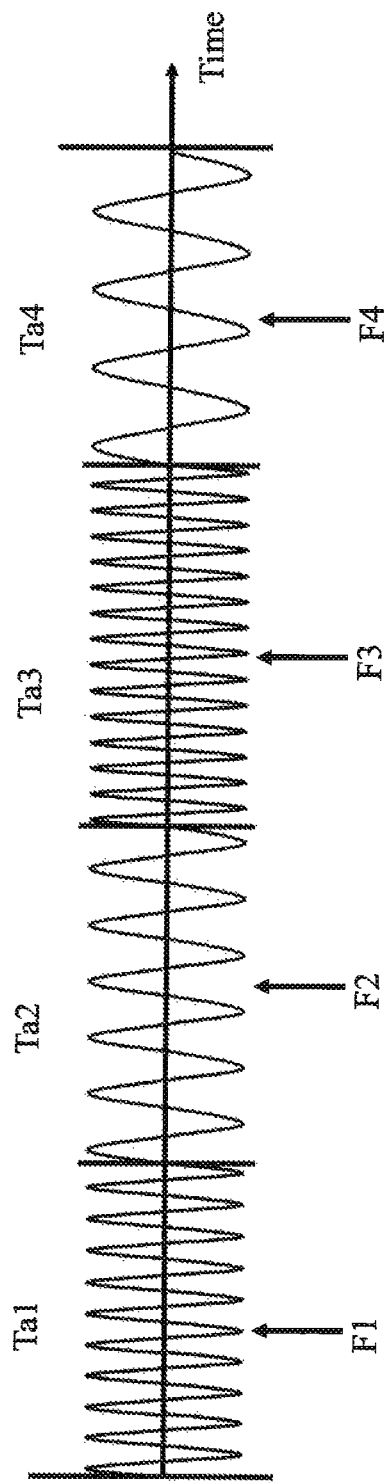
FIG. 2A is based on FIG. 2 and illustrates relationship between the vibrating working periods and vibrating frequencies for the fan control method of the first embodiment of the present invention.

First, the control module 12 sets a plurality of vibrating working periods and a plurality of vibrating frequencies of the air pump fan device 20. As illustrated in FIG. 2A which is based on FIG. 2 and illustrates relationship between the vibrating working periods and vibrating frequencies for the fan control method of the first embodiment of the present invention. The control module 12 sets vibrating working periods Ta1 to Ta4 and vibrating frequencies F1 to F4. Please be noted that the value setting may be implemented by hardware architecture of the control module 12 or by a memory module (not shown) for storing setting parameters, but the present invention is not limited by such configurations.

In the first embodiment, the vibrating frequencies F1 to F4 are of varying frequency values, and vibrating frequency values of each vibrating frequency of F1 to F4 are different. The different vibrating frequencies F1 to F4 may be varied in random within a varying range or varied according to a predetermined vibrating frequency ordering sequence. In a preferred embodiment of the present invention, the varying range of vibrating frequencies F1 to F4 are closed to an optimum vibrating frequency. For example, if the optimum vibrating frequency is 30 Hz, the varying range of vibrating frequencies F1 to F4 is between 25 Hz to 35 Hz. On the other hand, each of the vibrating working periods Ta1 to Ta4 is of fixed vibrating working time value or of different vibrating working time values, but the present invention is not limited to such configuration.

Next, the step 202 is performed for detecting a temperature in the electronic apparatus.

Next, the temperature sensing module 11 detects the temperature in the electronic apparatus 1 so that the control module 12 determines whether the electronic apparatus 1 needs to cool down.

Then, step 203 is performed for detecting whether the temperature in the electronic apparatus exceeds a first predetermined temperature.

Then, the control module 12 determines whether the temperature in the electronic apparatus 1 rises and exceeds the first predetermined temperature. The first predetermined temperature may be a temperature that may cause inner components of the electronic apparatus 1 to malfunction, but the present invention is not limited to such configuration.

If not, it means the temperature in the electronic apparatus 1 is still within safe range. To decrease power consumption of the electronic apparatus 1, the control module 12 pauses controlling the air pump fan device 20 to return to step 202 to continuously detecting the temperature in the electronic apparatus 1.

If the temperature in the electronic apparatus 1 exceeds the first predetermined temperature, step 204 is performed for controlling the air pump fan device to vibrate during the plurality of vibrating working periods according to the plurality of vibrating frequencies.

The control module 12 generates a control signal to the actuation module 21 to control the film vane 22 of the air pump fan device 20 to vibrate according to different vibrating frequencies F1 to F4 during the vibrating working periods Ta1 to Ta4. Each vibrating working period Ta1 to Ta4 corresponds to one of the vibrating frequencies F1 to F4. In addition, adjacent vibrating working periods Ta1 to Ta4 correspond to different vibrating frequency values. For example, the vibrating frequencies F1 to F4 may be varied in random within a varying range, e.g. to vary randomly between 25 Hz to 35 Hz, or be varied according to a predetermined vibrating frequency ordering sequence, e.g. an ordering sequence of 30 Hz, 26 Hz, 34 Hz, 27 Hz. Please be noted that the present invention is not limited to such examples. Meanwhile, different vibrating working periods Ta1 to Ta4 may have different working time values. For example, the vibrating working periods Ta1 to Ta4 may be varied in random in a predetermined range, like between 1 second to 3 seconds, or be varied according to a predetermined vibrating working period arrangement.

On the other hand, the vibrating working time values of the vibrating working periods Ta1 to Ta4 may also be adjusted according to the vibrating times of the film vane 22 of the air pump fan device 20. For example, the time for the film vane 22 of the air pump fan device 20 to vibrate for 30 times is set as a vibrating working period. With such variation control, the air pump fan device 20 does not continuously vibrate under a same vibrating frequency, so as to lower awareness of a user to the generated noise.

Finally, the step 205 is performed to determine whether the temperature of the electronic apparatus is lower than a second predetermined temperature.

Finally, after controlling the air pump fan device 20 to vibrate, the control module 12 detects the temperature in the electronic apparatus 1 with the temperature sensing module 11 to determine whether the temperature of the electronic apparatus 1 is lower than the second predetermined temperature to determine whether the electronic apparatus 1 has cooled down. Please be also noted that the control module 12 may performs determination after each vibrating working period, Ta1, Ta2, Ta3, or Ta4, or performs temperature detection of the electronic apparatus 1 after vibration working periods of Ta1 to Ta4, but the present invention is not limited to only such configuration.

Therefore, when the electronic apparatus 1 still has a temperature over the second predetermined temperature, it is returned to step 204 so that the air pump fan device 20 continues to cool down the electronic apparatus 1.

On the other hand, when the electronic apparatus 1 has a temperature lower than the second predetermined temperature, step 206 is performed for stopping control of the air pump fan device.

In such case, the control module 12 stops controlling the air pump fan device 20 so that the film vane 22 of the air pump fan device 20 stops vibrating to save power. Finally, it is returned to step 202 to continuously detect the temperature of the electronic apparatus 1 until the temperature of the electronic apparatus again exceeds the first predetermined temperature for re-actuation.

Moreover, the second predetermined temperature of step 205 does not need to be the same as the first predetermined temperature in step 203. The second predetermined temperature may be lower than the first predetermined temperature. That is, when the control module 12 again determines whether the electronic apparatus 1 has cooled down and the temperature of the electronic apparatus is really lower than the temperature that causes inner components of the electronic apparatus 1 to malfunction, the control is stopped. Therefore, in a preferred embodiment, the second predetermined temperature is lower than the first predetermined temperature.

Figure 3:
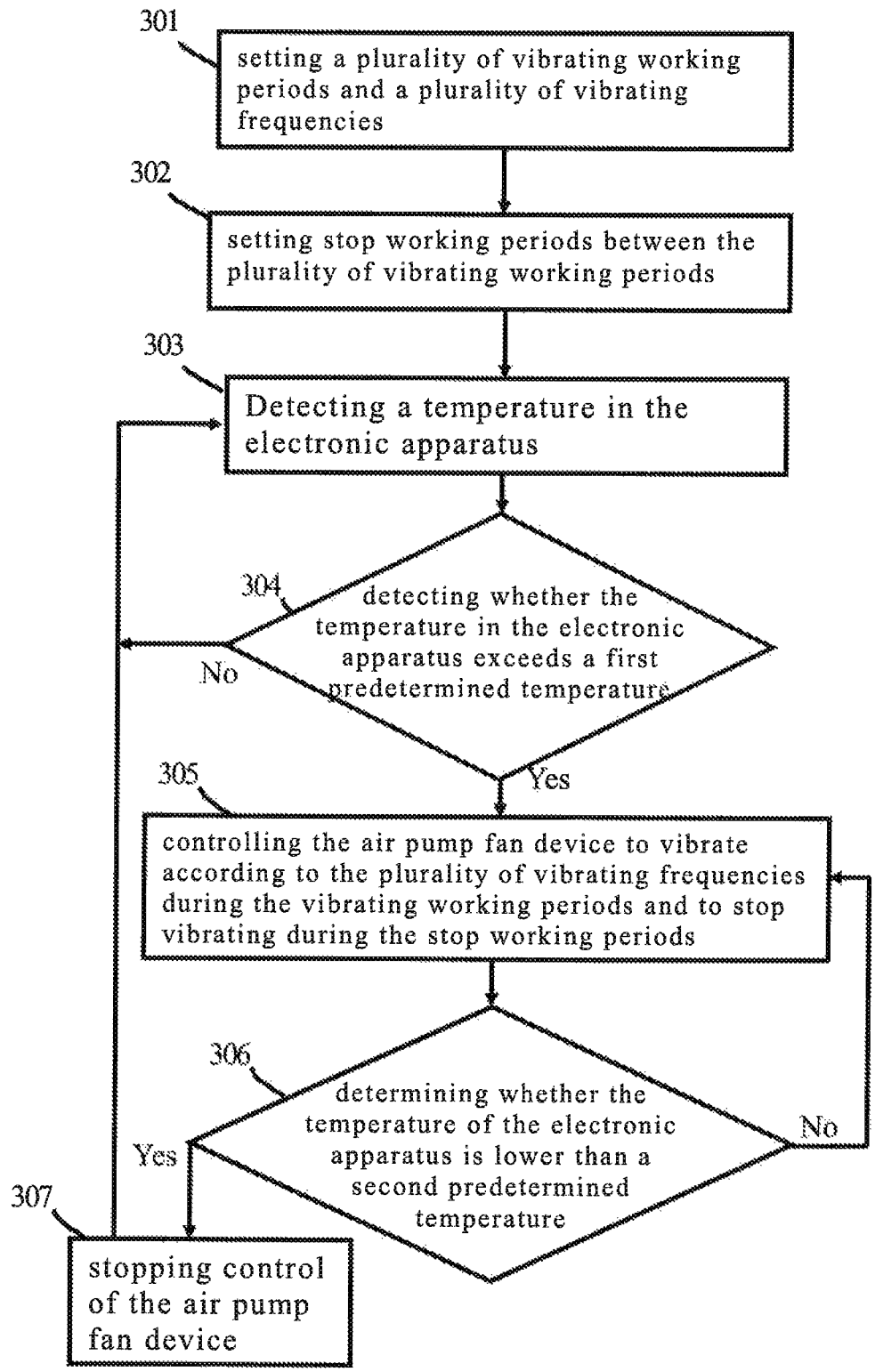
FIG. 3 is a flowchart for the fan control method of a second embodiment of the present invention.
Figure 3A:
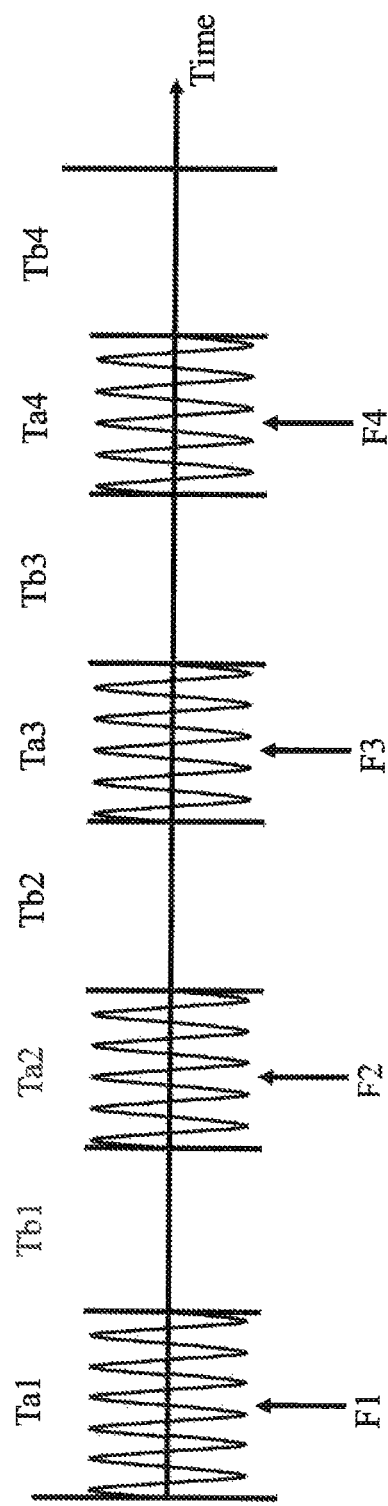
FIG. 3A is based on FIG. 3 and illustrates relationship among vibrating working periods, stop working periods and vibrating frequencies of the second embodiment of the fan controlling method of the present invention.

Next, please refer to FIG. 3 which illustrates a flowchart for the fan control method of a second embodiment of the present invention, and refer to FIG. 3A which is based on FIG. 3 and illustrates relationship among vibrating working periods, stop working periods and vibrating frequencies of the second embodiment of the present invention.

First, step 301 is performed for setting a plurality of vibrating working periods and a plurality of vibrating frequencies.

First, the control module 12 sets a plurality of vibrating working periods Ta1 to Ta4 and a plurality of vibrating frequencies F1 to F4 of the air pump fan device 20. In the second embodiment, the plurality of vibrating frequencies F1 to F4 are of the same frequency value. Meanwhile, the vibrating working periods Ta1 to Ta4 also have the same vibrating working time value.

Next, step 302 is performed for setting stop working periods between the plurality of vibrating working periods.

Next, the control module 12 sets additional stop working periods between one vibrating working period and another vibrating working period. In the second embodiment, the intervals between the vibrating working periods are set with stop working periods Tb1, Tb2, Tb3, and Tb4. During these stop working periods Tb1, Tb2, Tb3 and Tb4, the air pump fan device 20 stops vibration. In the second embodiment of the present invention, the stop working periods Tb1 to Tb4 have the same stop working time value.

Then, step 303 and step 304 are performed for detecting the temperature of the electronic apparatus 1 for the control module 12 to determine whether the temperature of the electronic apparatus 1 exceeds the first predetermined temperature of the electronic apparatus 1. Because step 303 and step 304 are similar to step 202 and step 203, they are not explained further for clarity.

If not, the control module 12 pauses control of the air pump fan device 20 and it is returned to step 303 to continuously detect the temperature of the electronic apparatus 1.

If the electronic apparatus 1 has a temperature over the first predetermined temperature, step 305 is performed for controlling the air pump fan device to vibrate according to the plurality of vibrating frequencies during the vibrating working periods and to stop vibrating during the stop working periods.

The control module 12 generates a control signal to the actuation module 21 for controlling the film vane 22 of the air pump fan device 20 to vibrate according to the vibrating frequencies of F1, F2, F3, or F4 during the vibrating working periods Ta1, Ta2, Ta3, or Ta4, and to stop vibrating during stop working periods of Tb1, Tb2, Tb3, or Tb4. For example, the vibrating frequencies F1, F2, F3, or F4 may be set as 30 Hz, the vibrating working periods Ta1, Ta2, Ta3, or Ta4 as 1 second, and the stop working periods Tb1, Tb2, Tb3, and Tb4 as 0.5 second. Therefore, after the air pump fan device 20 vibrates for 1 second, it stops vibration for 0.5 second. With such repeated cycling, the air pump fan device 20 does not vibrate continuously, so that the user would less aware of the generated noise.

Finally, step 306 and 307 are performed to ensure whether the electronic apparatus 1 is cooled down and has a temperature lower than the second predetermined temperature. Because step 306 and 307 are similar to step 205 and step 206, they are not further described here.

When the electronic apparatus 1 has cooled down, the control module 12 stops controlling the air pump fan device 20 so that the film vane 22 of the air pump fan device 20 stops vibration to save energy. Finally, it is returned to step 303 to continuously detect the temperature of the electronic apparatus 1 until the electronic apparatus 1 has a temperature exceeding the first predetermined temperature.

Figure 4:
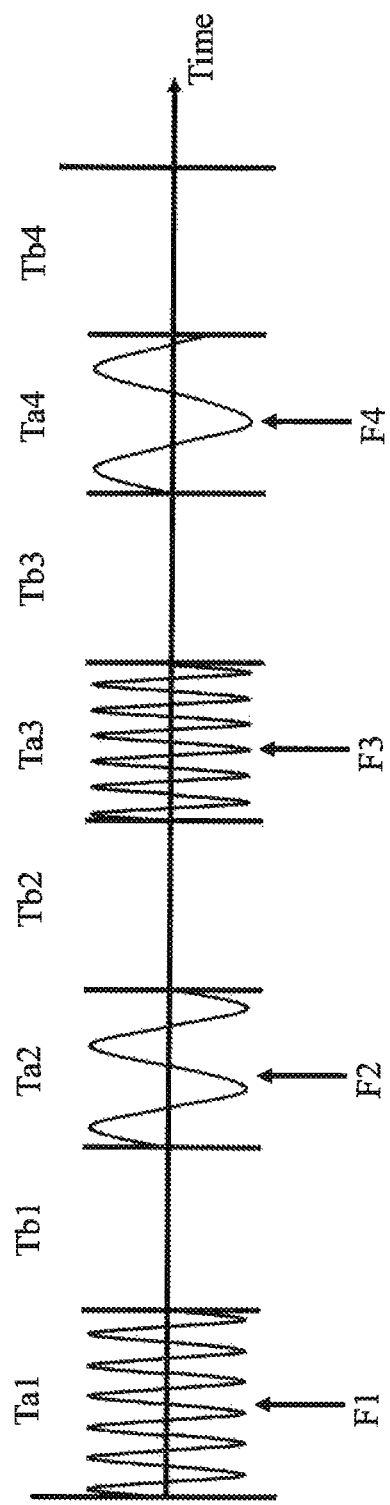
FIG. 4 illustrates relationship among the vibrating working periods, the stop working periods and the vibrating frequencies of the third embodiment of the fan controlling method of the present invention.

Next, please refer to FIG. 4, which illustrates relationship among the vibrating working periods, the stop working periods and the vibrating frequencies of a third embodiment of the fan controlling method of the present invention.

The present invention is not limited to that the vibrating frequencies of F1, F2, F3, and F4, the vibrating working periods Ta1, Ta2, Ta3, and Ta4, and the stop working periods Tb1, Tb2, Tb3, and Tb4 have the same values, respectively. In step 301 and step 302, the vibrating frequencies F1 to F4, vibrating working periods Ta1 to Ta4 and stop working periods Tb1 to Tb4 may be set as the same values or different values. In the third embodiment of the present invention, the vibrating working periods Ta1, Ta2, Ta3, and Ta4 are fixed as one second, and the stop working periods Tb1, Tb2, Tb3, and Tb4 are fixed as 0.5 second. The vibrating frequencies F1 to F4 may have a varying frequency value, e.g. being varied in random in a predetermined range, like between 25 Hz to 35 Hz, or may be varied according an predetermined vibrating frequency ordering sequence of 30 Hz, 26 Hz, 35 Hz, 27 Hz. The present invention, however, is not limited to such examples.

Figure 5:
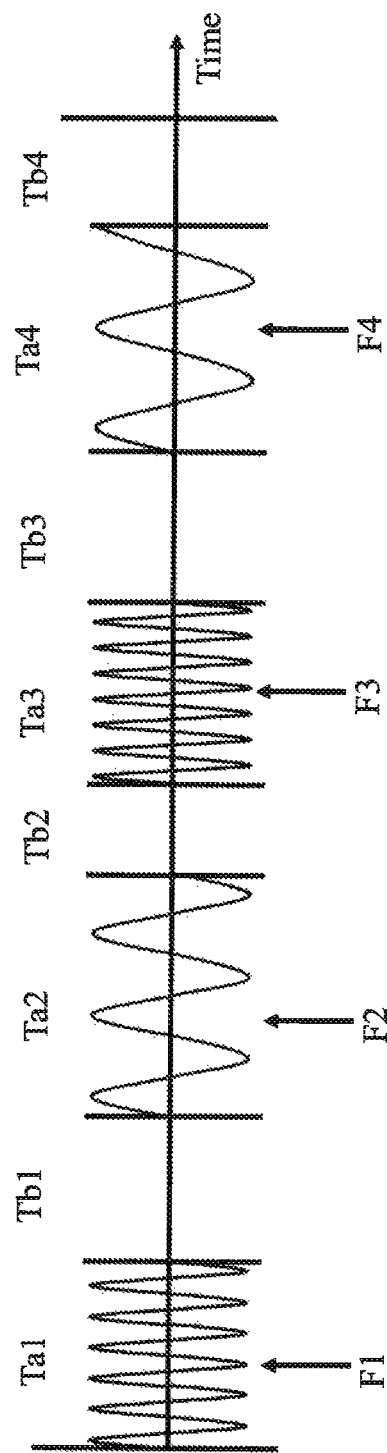
FIG. 5 illustrates the relationship among the vibrating working periods, the stop working periods and the vibrating frequencies of a fourth embodiment of the fan controlling method of the present invention.

Next, please refer to FIG. 5, which illustrates relationship among the vibrating working periods, the stop working periods and the vibrating frequencies of a fourth embodiment of a fan controlling method of the present invention.

The vibrating working periods Ta1 to Ta4 and stop working periods Tb1 to Tb4 may also set as different time values. For example, the vibrating working periods Ta1 to Ta4 and stop working periods Tb1 to Tb4 may be varied in random in a predetermined range, like between 1 second to 3 seconds, or be varied according to a predetermined ordering sequence of the vibrating working period and stop working periods while the total time of vibrating working periods and the stop working periods is fixed. For example, the vibrating working periods and the stop working periods are together fixed to 1.5 second. Therefore, when the vibrating working period Ta1 is 1 second, the stop working period Tb1 is 0.5 second. When the vibrating working period Ta2 is 0.8 second, the stop working period Tb2 is 0.7 second.

Figure 6:
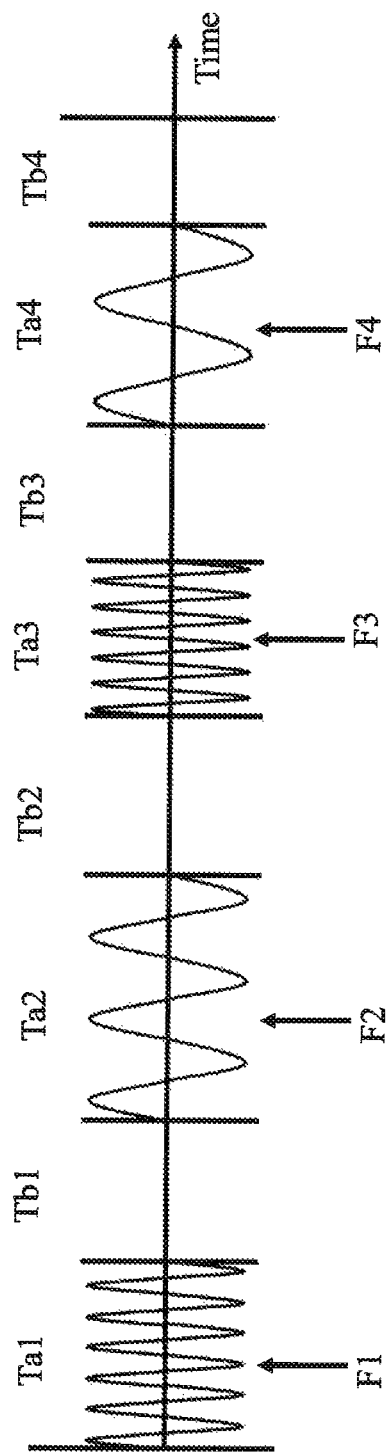
FIG. 6 illustrates relationship among the vibrating working periods, the stop working periods and the vibrating frequencies of the fifth embodiment of the fan controlling method of the present invention.

Next, please refer to FIG. 6, which illustrates relationship among the vibrating working periods, the stop working periods and vibrating frequencies of the fifth embodiment of the fan controlling method of the present invention.

The total time of the vibrating working periods and the stop working periods may be set as a non-fixed time value. The vibrating working periods Ta1 to Ta4 and stop working periods Tb1 to Tb4 may have different time values. For example, the vibrating working periods Ta1 to Ta4 and stop working periods Tb1 to Tb4 may be varied in random in a predetermined range, like between 1 second to 3 second, or be varied according to an ordering sequence of vibrating working periods and stop working periods. On the other hand, each of the vibrating working periods Ta1 to Ta4 may also have fixed vibrating working time value while each of the stop working periods Tb1 to Tb4 has different stop working time value. Similarly, the vibrating working periods Ta1 to Ta4 may have different vibrating working time values while the stop working periods Tb1 to Tb4 have fixed stop working time values.

The vibrating working periods Ta1 to Ta4 and the stop working periods Tb1 to Tb4 may also be adjusted according to the vibrating times of the air pump fan device 20, but the present invention is not limited to such configuration.

It is noted that the method is not limited to the order of the steps disclosed herein, and the method can have another order of steps as long as the object of the present invention is fulfilled.

As explained above, the vibrating frequencies F1, F2, F3, and F4, the vibrating working periods Ta1, Ta2, Ta3, and Ta4, the stop working periods Tb1, Tb2, Tb3, and Tb4 may be set as fixed values or varying values so that the film vane 22 of the air pump fan device 20 does not vibrate with the same frequency for long time and thus a user would not notice the noise continuously.

Although the present invention has been explained in relation to its preferred embodiments, it is to be understood that many other possible modifications and variations can be made without departing from the spirit and scope of the present invention as hereinafter claimed.

What is claimed is:

1. A fan controlling method for controlling an air pump fan device in an electronic apparatus, wherein the air pump fan device is installed in the electronic apparatus, the method comprising:
setting a plurality of vibrating working periods of the air pump fan device; setting a plurality of vibrating frequencies of the air pump fan device, wherein each vibrating frequency has a different vibrating frequency value;
setting a stop working period with a fixed stop working period time value or a plurality of stop working periods with different stop working time values between adjacent vibrating working periods of the plurality of vibrating working periods;
detecting a temperature of the electronic apparatus;
determining whether the temperature of the electronic apparatus exceeds a first predetermined temperature;
if the temperature exceeds the first predetermined temperature, controlling the air pump fan device to vibrate according to the plurality of vibrating frequencies during the plurality of vibrating working periods, wherein adjacent vibrating working periods of the plurality of vibrating working periods correspond to different vibrating frequency values; and
controlling the air pump fan device to stop vibration during the stop working period with the fixed stop working period time value or the plurality of stop working periods with different stop working time values.

2. The fan controlling method as claimed in claim 1, wherein each of the plurality of vibrating working periods has a different vibrating working time value.

3. The fan controlling method as claimed in claim 2, wherein the vibrating working time values of the plurality of vibrating working periods are varied in random in a predetermined range or varied according to a predetermined vibrating working period ordering sequence for the vibrating working time values.

4. The fan controlling method as claimed in claim 3, wherein the plurality of vibrating frequencies are varied in random in a predetermined range or varied according to a predetermined vibrating frequency ordering sequence for the vibrating frequency values.

5. The fan controlling method as claimed in claim 1, wherein the plurality of vibrating frequencies are of a fixed frequency value, and each of the plurality of vibrating working periods has a fixed vibrating working time value.

6. The fan controlling method as claimed in claim 1, wherein the plurality of vibrating frequencies are varied in random in a predetermined range or varied according to a predetermined vibrating frequency ordering sequence for the vibrating frequency values.

7. The fan controlling method as claimed in claim 1, further comprising:

after controlling the air pump fan device to vibrate, determining whether the temperature of the electronic apparatus is lower than a second predetermined temperature, wherein the first predetermined temperature is higher than the second predetermined temperature; and if yes, stopping to vibrate the air pump fan device.

8. A fan control system used in an electronic apparatus for controlling an air pump fan device, wherein the air pump fan device is installed in the electronic apparatus, the fan control apparatus comprising:

a temperature sensing module for detecting a temperature in the electronic apparatus; and a control module electrically connected to the temperature sensing module and the air pump fan device for setting a plurality of vibrating working periods and a plurality of vibrating frequencies of the air pump fan device, wherein each of the plurality of vibrating frequencies has a different vibrating frequency value, and setting a stop working period with a fixed stop working period time value or a plurality of stop working periods with different stop working time values between two adjacent vibrating working periods of the plurality of working periods;

wherein when the temperature in the electronic apparatus exceeds a first predetermined temperature, the control module generates a control signal for controlling the air pump fan device to vibrate during the plurality of vibrating working periods according to the plurality of vibrating frequencies and controlling the air pump fan device to stop vibration during the stop working period with the fixed stop working period time value or the plurality of stop working periods with different stop working time values, wherein adjacent vibrating working periods of the plurality of vibrating working periods corresponds to different vibrating frequency values.

9. The fan control system as claimed in claim 8, wherein each of the plurality of vibrating working periods has a different vibrating working time value.

10. The fan control system as claimed in claim 9, wherein the plurality of vibrating working periods are varied in random in a predetermined range or varied according to a predetermined vibrating working period ordering sequence for the vibrating working time values.

11. The fan control system as claimed in claim 10, wherein the plurality of vibrating frequencies are varied in random in a predetermined range or varied according to a predetermined vibrating frequency ordering sequence for the vibrating frequency values.

12. The fan control system as claimed in claim 8, wherein:

the plurality of vibrating frequencies are all of a fixed frequency value; and each of the plurality of vibrating working periods has a fixed vibrating working time value.

13. The fan control system as claimed in claim 8, wherein the plurality of vibrating frequencies are varied in random in a predetermined range or varied according to a predetermined vibrating frequencies ordering sequence for the vibrating frequency values.

14. The fan control system as claimed in claim 8, wherein after controlling the air pump fan device to vibrate, the control module further determines whether the temperature in the electronic apparatus is lower than a second predetermined temperature, the first predetermined temperature being higher than the second predetermined temperature; and if yes, the control module stops vibrating the air pump fan device.

15. A fan control system used in an electronic apparatus for controlling an air pump fan device, wherein the air pump fan device is installed in the electronic apparatus, the fan control apparatus comprising:

a temperature sensing module for detecting a temperature in the electronic apparatus; and a control module electrically connected to the temperature sensing module and the air pump fan device for setting a plurality of vibrating working periods and a plurality of vibrating frequencies of the air pump fan device, wherein adjacent vibrating working periods of the plurality of vibrating working periods correspond to different vibrating working time values, each of the plurality of vibrating frequencies has a different vibrating frequency value; wherein the plurality of vibrating working periods are varied in random in a predetermined range or varied according to a predetermined vibrating working period ordering sequence for the vibrating working time values;

wherein when the temperature in the electronic apparatus exceeds a first predetermined temperature, the control module generates a control signal for controlling the air pump fan device to vibrate during the plurality of vibrating working periods according to the plurality of vibrating frequencies, wherein adjacent vibrating working periods of the plurality of vibrating working periods correspond to different vibrating frequency values.

* * * * *